United States Patent [19]

Castleberry

[11] Patent Number: 5,489,551
[45] Date of Patent: Feb. 6, 1996

[54] METHOD OF FABRICATING THIN FILM CIRCUITS WITH HIGH DENSITY CIRCUIT INTERCONNECTS BY PYROLOSIS OF AN ADHESIVE

[75] Inventor: Donald E. Castleberry, Schenectady, N.Y.

[73] Assignee: General Electric Company, Schenectady, N.Y.

[21] Appl. No.: 376,209

[22] Filed: Jan. 20, 1995

Related U.S. Application Data

[62] Division of Ser. No. 237,702, May 3, 1994, Pat. No. 5,463,642.

[51] Int. Cl.$^6$ ............................ H01L 21/283; H01L 21/60
[52] U.S. Cl. ............................ 437/173; 437/180; 437/182
[58] Field of Search .................................. 437/173, 180, 437/182, 943

[56] References Cited

U.S. PATENT DOCUMENTS

| | | | |
|---|---|---|---|
| 4,691,091 | 9/1987 | Lyons et al. | 174/126 C |
| 5,182,230 | 1/1993 | Donelon et al. | 437/173 |
| 5,290,732 | 3/1994 | Kumar et al. | 437/183 |
| 5,303,074 | 4/1994 | Salisbury | 359/59 |
| 5,316,204 | 5/1994 | Takehashi et al. | 228/179.1 |
| 5,349,238 | 9/1994 | Ohsawa et al. | 257/736 |

FOREIGN PATENT DOCUMENTS

| | | |
|---|---|---|
| 45-21530 | 7/1970 | Japan . |
| 57-106141 | 7/1982 | Japan . |
| 4179135 | 6/1992 | Japan . |

OTHER PUBLICATIONS

G. Kramer, "Thin–Film–Transistor Switching Matrix for Flat–Panel Displays," Proceeding of the S.I.D., vol. 16/3, Third Quarter 1975, pp. 152–158.

*Primary Examiner*—George Fourson
*Assistant Examiner*—David E. Graybill
*Attorney, Agent, or Firm*—Donald S. Ingraham; Marvin Snyder

[57] ABSTRACT

A method of fabricating a high density thin film circuit includes the step of bonding a high density connector having a plurality of electrical connection lines with a wafer having a plurality of electrical contact pads arranged in a pattern with a pitch less than about 100 μm so that an electrical coupling is formed between the wafer contact pads and connector electrical connection lines. The step of forming the electrical coupling comprises pyrolysis of an adhesive disposed between the high density connector and said wafer. The electrical coupling between the contact pads and electrical connection lines is formed by directing a laser beam on the area in which the electrical coupling is to be formed so as to cause thermal decomposition of the adhesive to form a conductive carbon material; portions of the wafer contact pads and the connector electrical connection lines are also welded to the conductive carbon material.

14 Claims, 2 Drawing Sheets

5,489,551

METHOD OF FABRICATING THIN FILM CIRCUITS WITH HIGH DENSITY CIRCUIT INTERCONNECTS BY PYROLOSIS OF AN ADHESIVE

This application is a division of application Ser. No. 08/237,702, filed May 3, 1994, U.S. Pat. No. 5,463,642.

BACKGROUND OF THE INVENTION

Thin film arrays used in imagers or liquid crystal displays typically must be coupled to electronic control circuits that are situated off of the wafer on which the array components are disposed. As the number of active components in arrays has increased (e.g., photodetectors in radiation imagers), the electrical connection circuits to enable each component on the array to be addressed have become more complex.

For example, in high resolution large area (e.g., 20 $cm^2$ or larger) radiation imager arrays comprising about 1,000,000 pixels, about 2000 electrical connections must be made to the components on the substrate. In such arrays, the pitch (center to center spacing) of the contact pads is small, that is, less than about 100 μm. In conventional, low resolution arrays, the pitch of the electrical connection contact pads is greater than about 150 μm.

Conventional methods of making contacts to low resolution arrays include the use of an elastomeric connector material having small (e.g., diameters in the range of 25 μm to 50 μm) conducting particles mixed therein to make electrical contact between the electrically conductive lines on the substrate and the connection lines on a circuit board containing the control circuits; a mechanical clamping device maintains contact between the electrical lines on the array wafer and external circuit connection lines. A second method uses an anisotropic conducting film (ACF) material that comprises an electrically insulating thermoplastic or thermosetting adhesive that has conducting metal particles mixed into the adhesive. The external circuit usually is a flexible printed circuit or a tape automated bonded (TAB) circuit. The ACF material is used to bond the external circuit to the array wafer (e.g., to the portion of the glass substrate with the contact pads) under heat and pressure; contact is made between the external circuit contacts, the metal particles imbedded in the adhesive, and the relatively large area (e.g., corresponding to a pitch greater than about 150 μm) contact pads on the array wafer. Both of these methods are limited to low resolution devices by the density of conducting particles that can be placed in the elastomer or ACF before shorting between adjacent contacts becomes probable. The resolution of standard printed circuit and TAB technology is typically greater than 150 μm and thus also limits the resolution of these schemes.

It is particularly desirable to be able to make electrical contacts between fine pitch imagers (e.g., having a pitch in the range of 10–100 μm) and external control electronics in order to make use of amorphous silicon (a-Si) technology in forming the array thin film circuits; the a-Si technology provides ease of fabrication and consistent uniformity necessary for high yields that is not available from single crystal silicon technology, which has been investigated to provide an alternative means to develop high resolution arrays with small pitch connection requirements.

It is thus an object of this invention to provide a method of coupling a high density thin film circuit (e.g., having contact pads with a pitch less than about 100 μm) to corresponding contacts on an external connector.

It is a further object of this invention to provide an amorphous silicon high density thin film circuit having contact pads of with a pitch in the range of about 10 μm to 100 μm that is coupled to an external control circuit.

SUMMARY OF THE INVENTION

In accordance with this invention, a method of fabricating a high density thin film circuit includes the steps of aligning a high density connector having a plurality of electrical connection lines with a wafer having a plurality of electrical contact pads disposed in an interconnect area on the wafer, and then bonding the high density connector to the wafer so that at least one electrical coupling is formed between respective ones of the wafer contact pads and corresponding ones of connector electrical connection lines. The step of forming the electrical coupling comprises pyrolysis of an adhesive disposed between said high density connector and the wafer. The connector electrical connection lines are arranged in a pattern corresponding to the pattern of the wafer contact pads in the interconnect area. The pitch of the wafer contact pads in the interconnect area is less than about 100 μm, and typically is less than about 50 μm.

The adhesive is spread between the wafer contact pads and the connector electrical connection lines; the adhesive is nonconductive and typically comprises a organic thermoplastic adhesive or an organic themosetting adhesive. The step of forming the electrical coupling between respective ones of the contact pads and corresponding connector electrical connection lines typically comprises directing a laser beam on the area in which the electrical coupling is to be formed; pulses of the laser beam result in thermal decomposition of the adhesive to form a conductive carbon material; portions of the wafer contact pad and the connector electrical connection line are typically also mixed with the conductive carbon material due the thermal heating of the pulse laser; the adhesive surrounding the electrical coupling between respective ones of the wafer contact pads and corresponding connector electrical connection lines remains non-conductive, providing electrical insulation between respective electrically coupled pairs of wafer contact pads and connector electrical connection lines.

A high density thin film circuit in accordance with this invention comprises a wafer having a plurality of electrical contact pads arranged in a selected pattern in an interconnect area of the wafer, and a high density connector bonded to the wafer, the connector comprising a plurality of electrical connection lines disposed in a pattern corresponding to the contact pads in the interconnect area of the wafer, with respective ones of the electrical connection lines being electrically coupled to corresponding ones of the wafer contact pads. The electrical coupling between the connector electrical connection lines and the wafer contact pads comprises a pyrolytic weld, the weld comprising a conductive carbon material; the adhesive surrounding the pyrolytic weld is nonconductive. The pitch of the wafer contact pads is less than 100 μm and typically is about 50 μm or less.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIG. 1 (B) is a plan view of a portion of an interconnect area of a thin film circuit in accordance with this invention.

DETAILED DESCRIPTION OF THE INVENTION

Figures 1A, 1B:
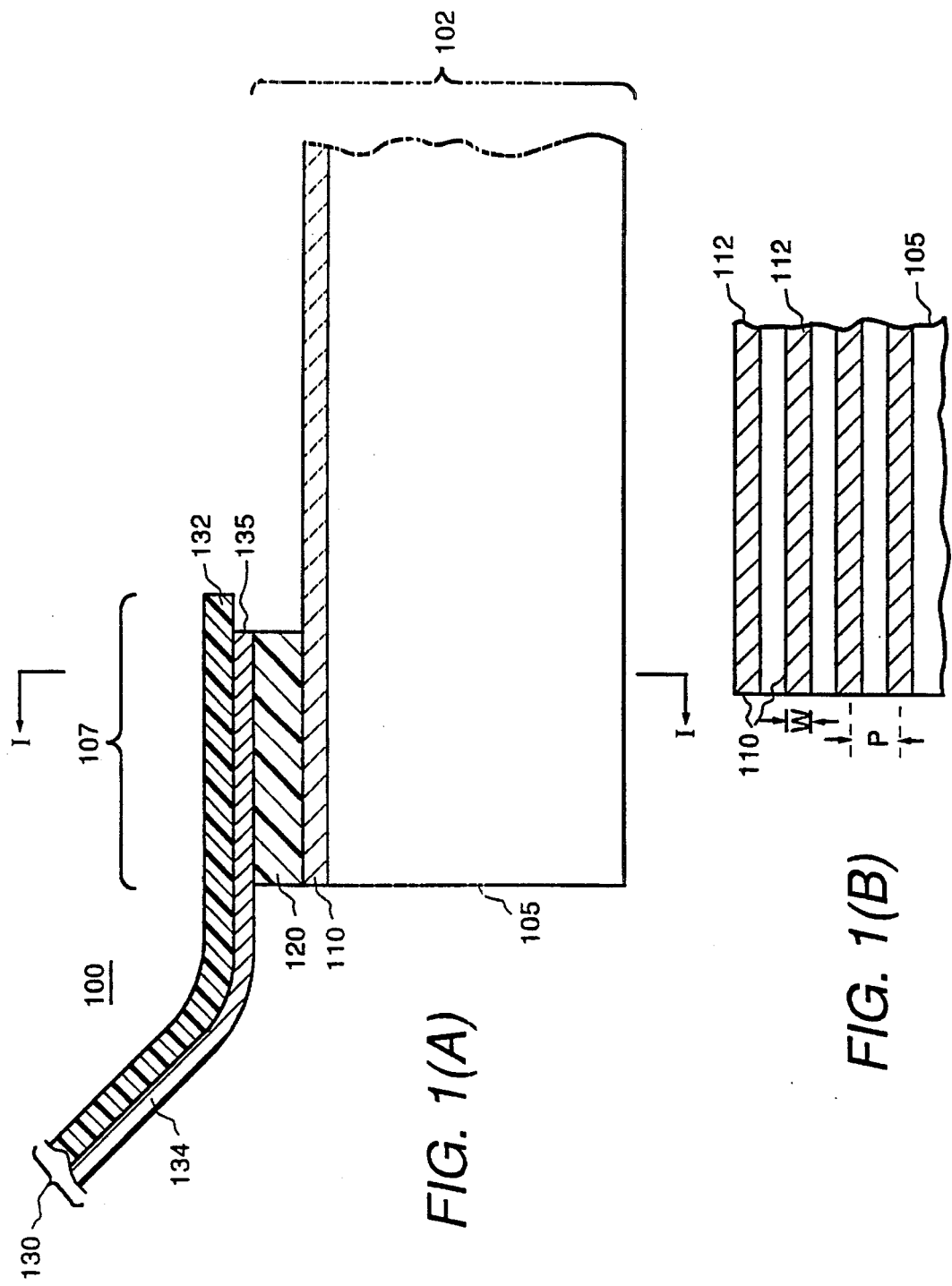
FIG. 1 (A) is a partial cross-sectional view and partial block diagram of a portion of a thin film circuit and associated fabrication equipment at one step of the present invention.

A thin film circuit 100 (FIG. 1 (A)) comprises a substrate 105 on which a plurality of electrical contact pads 110 are disposed. As used herein, "thin film circuit" refers to a wafer 102 on which arrays of active devices (not shown), such as photodetectors, liquid crystal displays, or the like, are disposed and associated electrical connection lines for coupling the active devices on the wafer to control circuits disposed off of substrate 105. Such arrays of active devices and associated address lines are typically fabricated in processes involving the deposition on substrate 105 and patterning of various conductive, semiconductive, and insulative materials to form the devices comprising the array. For example, radiation imager arrays typically comprise an array of amorphous silicon (a-Si) photodiodes coupled via thin film transistors to address lines to allow each respective photodiode to be coupled to readout electronics that are located off of substrate 105. This fabrication technology readily provides for high density arrays, that is arrays in which the pitch of the electrical connections is in the range between about 10 μm and 100 μm.

Substrate 105 typically comprises a non-conductive optically transparent material such as glass or the like. Address lines 112 (FIG. 1 (B)) coupled to the array of active devices (not shown) disposed on substrate 105 typically terminate in respective contact pads 110 near the edge of substrate 105 in an interconnect area 107. Contact pads 110 typically comprise copper, aluminum, titanium, nickel or the like. Contact pads 110 are arranged in a pattern in interconnect area 107 that corresponds to address lines 112 that are coupled to active devices in the array. For high resolution arrays (that is, arrays that comprise a large number of small size pixels to provide fine resolution in a display or imager), the pitch "P" (that is, the center to center spacing of the contact pads as illustrated in FIG. 1 (B)) of contact pads 110 is less than about 100 μm, and is typically 50 μm or less. The width "W" of each contact pad corresponds to the pitch (e.g., about the same as one-half the pitch), with the spacing between adjacent contact pads 110 disposed on substrate 105 being about equal to the width of the respective contact pads. For example, in high resolution arrays the width of each contact pad is typically in the range between about 25 μm and 50 μm. The thickness of each contact pad 110 (FIG. 1 (A)) is in the range between about 0.2 μm and 5 μm, and typically is about 1 μm.

In accordance with this invention, a high density connector 130 (FIG. 1 (A)) is disposed to provide electrical coupling between contact pads 110 and electronic control circuits (not shown) off of substrate 105. Connector 130 comprises a foundation 132 that typically is flexible (so as to provide easy connection to the control circuits) and comprises a thin polyimide film or the like; the thickness of the polyimide film comprising foundation 132 is typically about 50 μm thick.

A thin conductor layer, a portion of which is illustrated in FIG. 1 (A) as an electrical contact line 134, is disposed on foundation 132; the thickness of the conductor layer is in the range between about 1 μm and 20 μm. Conductor layer typically comprises copper, aluminum, titanium, nickel or the like. The conductive material is deposited on foundation 132 by sputtering or the like and is then patterned, such as in a photolithographic process, so that portions of the layer are etched away to form a plurality of electrical lines 134 that each terminate in a respective electrical connection line 135 (that is, the portion of the line at the terminus) near an edge of foundation 132. The pattern of electrical connection lines 135 formed in connector 130 corresponds to the pattern of contact pads 110 on substrate 105 such that each electrical connection line 135 corresponds with a respective contact pad 110. The pattern of electrical connection line thus has a high resolution pitch corresponding to the pitch of contact pads 110.

In accordance with the method of this invention, an adhesive 120 is disposed over contact pads 110 in interconnect area 107 (alternatively adhesive 120 can be applied to the corresponding portion of connector 130). Adhesive 120 comprises an organic thermoplastic adhesive, an organic thermosetting adhesive, or the like, and typically comprises a polymer, an epoxy, or an acrylic material. Adhesive 120 is non conductive (that is, an electrical insulator) when it has set, except for portions that are thermally decomposed as described below. The adhesive is typically applied by spraying, dipping, or the like so that the thickness of the adhesive between the surface of contact pad 110 and the surface of the corresponding electrical connection line 135 will be in the range between about 1 μm and 20 μm, and is typically about 5 μm.

Connector 130 is aligned with wafer 105 so that corresponding ones of electrical connection lines 135 are disposed opposite respective corresponding ones of contact pads 110. Typically this alignment can be done optically by sighting through transparent substrate 105 to align a selected contact pad 110 with its corresponding electrical connection line 135 on connector 130; alternatively, registration marks on wafer 102 and connector 130 are used to align connector 130 to wafer 102. The alignment of connector 130 further comprises disposing connector 130 in proximity to wafer 102 so that the selected thickness of adhesive 120 is disposed between the respective surfaces of corresponding contact pads 110 and electrical connection lines 135.

Thin film circuit 100 is processed to allow at least portions of adhesive 120 to set to provide a structural coupling between connector 130 and wafer 102. The setting of portions of adhesive 120 typically is done following alignment and disposition of connector 130 and wafer 102 in proximity to one another and prior to the formation of respective electrical couplings 125 (FIG. 2) between the wafer contact pads and connector electrical connection lines 135 (so as to minimize the chance of breaking an electrical connection), although alternatively the processing to set the adhesive can be done following the formation of the electrical couplings provided proper alignment of corresponding contact pads and electrical connection lines can be maintained to maintain the structural integrity of the electrical couplings.

In accordance with this invention, high density connector 130 is further bonded to wafer 102 so as to form electrical couplings 125 between respective wafer contact pads 110 and the corresponding connector electrical connection lines 135. Electrical coupling 125 is formed through thermal decomposition of adhesive 120 to form a conductive carbon material in electrical contact with the respective contact pad 110 and electrical connection line 135. For example, a laser beam 175 directed onto the area in which it is desired to form electrical coupling 125 (that is, in the area of alignment between corresponding ones of the wafer contact pads and connector electrical connection lines) and pulsed to deliver intense bursts of energy to cause the rapid thermal decomposition of adhesive in the irradiated area without causing significant thermal decomposition of adhesive surrounding the irradiated area. In this manner, non conductive adhesive 120 (that is, adhesive that has not undergone the thermal decomposition) surrounds each electrical coupling 125 to provide electrical isolation of that coupling between a respective pair of a coupled contact pad and electrical connection line.

Figure 2:
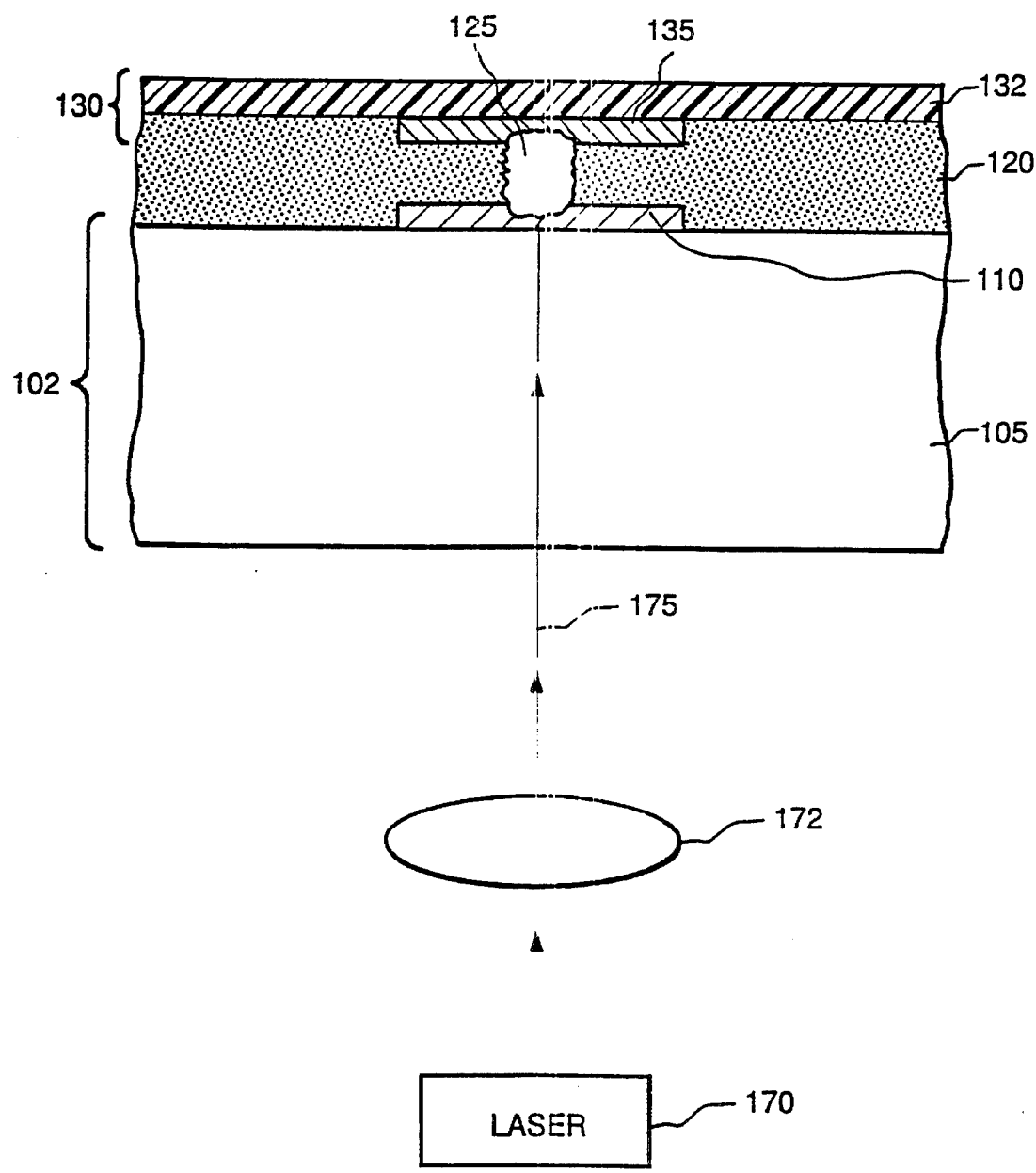
FIG. 2 is a cross-sectional view of a portion of a thin film circuit taken along the line I—I in FIG. 1 (A) in which a connector to external circuits has been coupled to contact pads on a thin film circuit wafer in accordance with this invention.

For example, a pulsed xenon laser 170 delivering about 100 µJ in a 1 µs pulse is optically coupled through focussing optics 172 to form a beam 175 directed to a 10 µm spot in the area of alignment between a contact pad/electrical connection line pair so as to produce electrical coupling 125 as illustrated in FIG. 2. The energy from the pulsed laser causes thermal decomposition of the organic adhesive (pyrolysis) to form the conducting carbon material and typically further causes mixing of the metal comprising contact pad 110 into the conducting carbon material and mixing of the metal comprising electrical connection line 135 into the conducting carbon material. Electrical coupling 125 thus typically comprises a pyrolytic weld, that is a fusion of the conductive carbon material left from the decomposition of the organic adhesive and metal from the respective contact pad 110 and electrical connection line 135. Alternatively, multiple electrical couplings 125 (not shown) can be formed at each pair of corresponding contact pads and electrical connection lines. For example, using the xenon laser noted above, the diameter of a typical electrical coupling 125 is about 10 µm (that is, corresponding to the diameter of the laser beam); thus multiple electrical couplings can be formed at each pair of contact pads and electrical connection lines for a contact pad 110 having a width of about 50 µm (the corresponding connector electrical connection line 135 having a similar width).

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a high density thin film circuit, comprising the step of:

bonding a high density connector to a wafer, said wafer comprising a plurality of electrical contact pads disposed in an interconnect area of said wafer, said plurality of contact pads being disposed in a pattern having a pitch of less than about 100 µm, said high density connector comprising a plurality of electrical connection lines disposed in a pattern corresponding to the pattern of said contact pads on said wafer;

the step of bonding further comprising forming at least one electrical coupling between one of said electrical connection lines and one of said contact pads, forming said electrical coupling further comprising pyrolysis of an adhesive disposed between said high density connector and said wafer.

2. The method of claim 1 further comprising the step of aligning said high density connector with said wafer so as to dispose contact pads in line with ones of the connector electrical connection lines.

3. The method of claim 1 further comprising the step of applying said adhesive to be disposed between said wafer and said connector in said interconnect area.

4. The method of claim 3 wherein said adhesive is selected from the group consisting of non conductive organic thermoplastic adhesives and non conductive organic thermosetting adhesives.

5. The method of claim 3 wherein the step of bonding wafer contact pads to connector electrical connection lines comprises thermally decomposing said adhesive and mixing portions of the decomposed adhesive and portions of said pads and said connection lines together.

6. The method of claim 3 wherein the step of forming electrical couplings between ones of said contact pads and said electrical connection lines comprises directing a beam from a laser on the area in which the electrical coupling is to be made so as to weld a wafer contact pad to a connector electrical connection line.

7. The method of claim 6 wherein the bonding of said wafer contact pad to said connector electrical connection line comprises thermally decomposing said adhesive to form a conductive carbon material.

8. The method of claim 7 wherein the welding of the contact pad to the electrical connection line further comprises welding a portion of said wafer contact pad to said conductive carbon material.

9. The method of claim 7 wherein the welding of the contact pad to the electrical connection line further comprises mixing a portion of said connector electrical connection line to said conductive carbon material.

10. The method of claim 7 wherein said laser comprises a pulsed xenon laser.

11. The method of claim 1 wherein the pattern of the wafer contact pads has a pitch of less than about 50 µm.

12. The method of claim 1 further comprising the steps of forming said high density connector, the formation of said connector further comprising the steps of:

depositing a conductor on a flexible foundation; and etching said conductor in accordance with said pattern corresponding to the pattern of said contact pads on said wafer to form said electrical connection lines.

13. The method of claim 2 wherein said wafer comprises an optically transparent substrate and further comprises a plurality of active components disposed in an array on said substrate, said active components comprising amorphous silicon.

14. The method of claim 13 wherein the step of forming said electrical coupling further comprises forming a plurality of electrical couplings between each contact pad and electrical connection line.

* * * * *